United States Patent [19]

George

[11] Patent Number: 4,556,867

[45] Date of Patent: Dec. 3, 1985

[54] DUAL RATE, INTEGRATING, ANALOG-TO-DIGITAL CONVERTER

[75] Inventor: Richard E. George, Everett, Wash.

[73] Assignee: John Fluke Mfg. Co., Inc., Everett, Wash.

[21] Appl. No.: 438,374

[22] Filed: Nov. 1, 1982

[51] Int. Cl.[4] .............................................. H03K 13/02
[52] U.S. Cl. ..................... 340/347 NT; 340/347 AD; 340/347 CC; 340/347 M; 324/99 D
[58] Field of Search ................ 340/347 NT, 347 AD, 340/347 M, 347 CC; 324/96, 99 D

[56] References Cited

U.S. PATENT DOCUMENTS

| | | | |
|---|---|---|---|
| 3,654,560 | 4/1972 | Cath et al. ........................ | 328/127 |
| 3,879,724 | 4/1975 | McDonald ........................ | 328/158 X |
| 3,961,256 | 6/1976 | Gaskell et al. .................... | 324/96 |
| 4,194,183 | 3/1980 | Neuner et al. .................... | 340/347 M X |
| 4,395,701 | 7/1983 | Evans ............................... | 340/347 M X |

Primary Examiner—T. J. Sloyan
Attorney, Agent, or Firm—Mikio Ishimaru; Stephen A. Becker

[57] ABSTRACT

A dual slope analog to digital (A/D) converter starts by auto zeroing and making a number of high speed A/D samples before auto zeroing again. A microprocessor causes output of the high speed samples for a bar graph and applies predetermined correction factors to allow accumulation of the high speed samples to provide a high accuracy numerical output.

14 Claims, 3 Drawing Figures

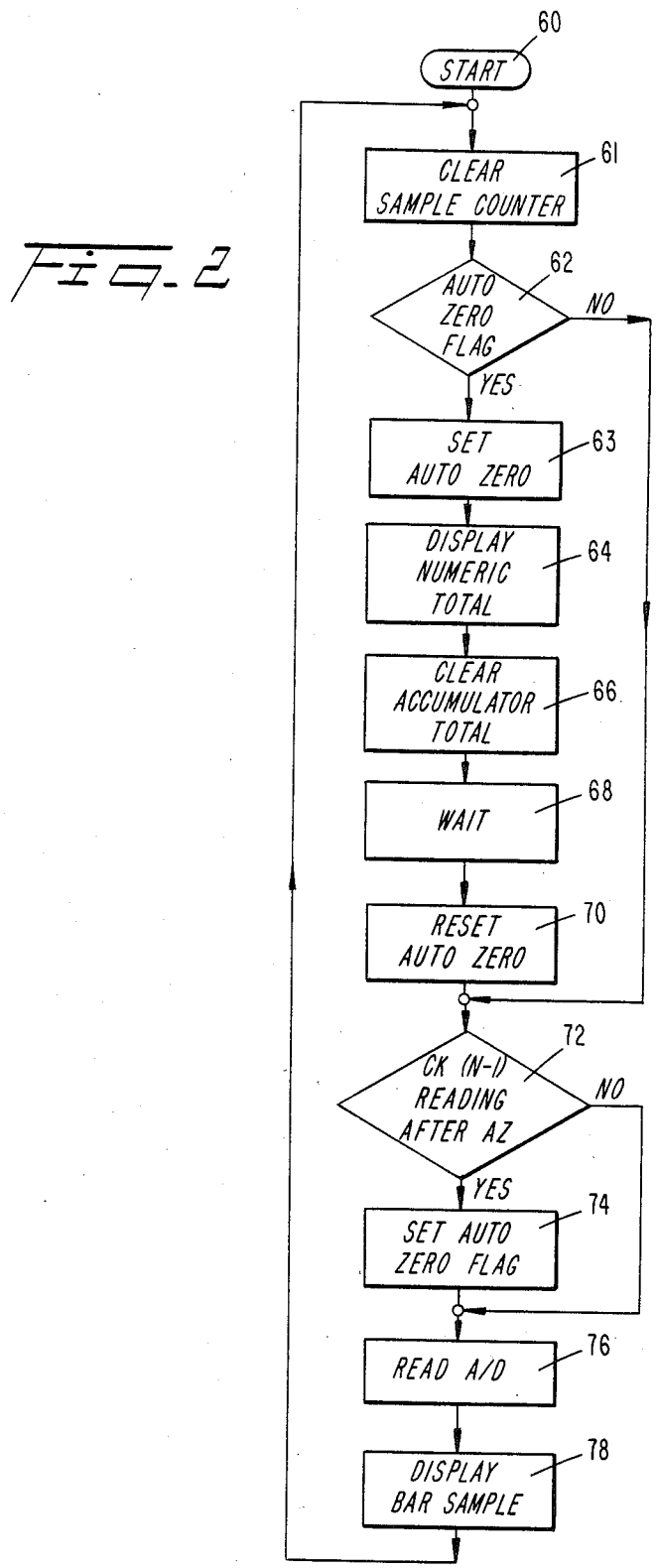

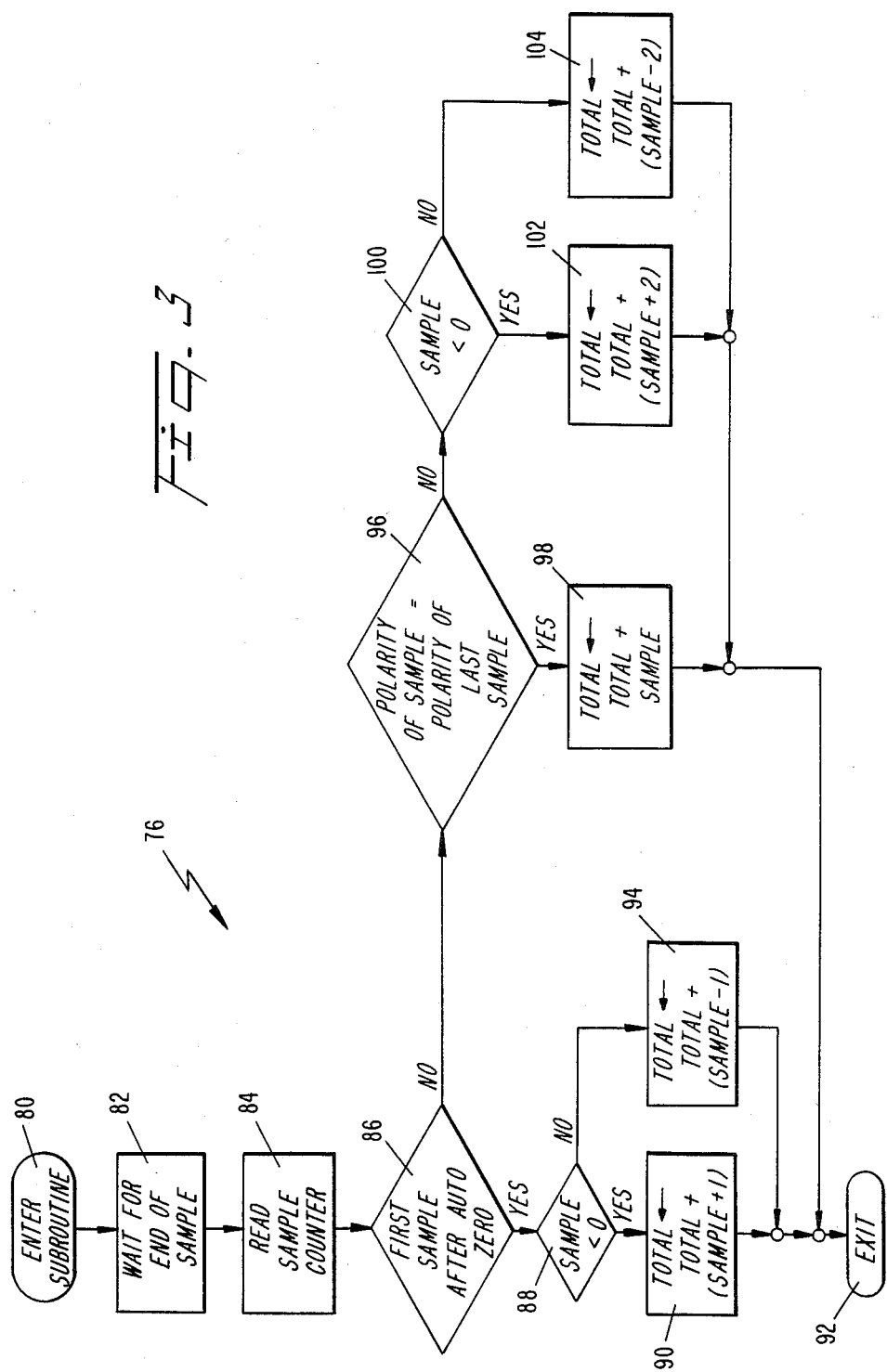

DUAL RATE, INTEGRATING, ANALOG-TO-DIGITAL CONVERTER

FIELD OF THE INVENTION

The present invention relates generally to integrating dual-slope analog to digital converters.

BACKGROUND OF THE INVENTION

In the past, the conventional dual slope analog to digital (A/D) converter processed analog signals by establishing an accurate zero signal baseline (auto zero) for the converter prior to integrating the analog signal. After integrating the analog signal, an opposite polarity reference signal was integrated back to the zero baseline. The time required to reach the zero baseline was measured in digital clock signals, or periods, which established the digital representation of the analog signal. Because of the unavoidable integrator overshoot pass the zero baseline, to have any degree of conversion accuracy it has always been necessary to re-establish the accurate zero baseline (auto zero) of the converter prior to taking additional readings.

With the above system, for a given conversion accuracy, the rate at which conversions are made can only be speeded up by increasing the frequency of the clock. In certain applications, both high rate low accuracy samples, and low rate higher accuracy conversions are required, but the penalties associated with a high frequency clock are not acceptable.

Previously, there have been two approaches to making simultaneous analog to digital conversions at two different rates with different degrees of accuracy. The first required separate conversion systems for the two rates which resulted in higher costs for the two separate systems. The second was by providing a fast clock period for converting at the fastest rate at the full desired resolution but with poor noise rejection characteristics. Such conversions would be followed by digital filtering for lower noise, and therefore higher accuracy, at a slower rate.

However, a fast clock period requires increased attention to noise and bandwidth effects, and requires critical conversion system components, leading towards increases both in power consumption and in costs.

Heretofore, there has been no way of applying dual slope A/D techniques and economically obtaining both a high rate of analog to digital sampling with lowered accuracy while obtaining a lower rate of conversion with higher accuracy. With a dual rate conversion system, it would be possible to display an analog signal represented, by a high speed bar graph, and a slower numeric-digital display.

SUMMARY

The present invention provides an integrating dual-slope analog to digital converter capable of providing a high rate of sampling with low accuracy.

The present invention further provides an integrating dual-slope analog to digital converter capable of providing a high rate of sampling with low accuracy while simultaneously providing a low rate of conversions with higher accuracy.

The present invention further provides an analog to digital converter capable of simultaneously providing displays in both bar graph and numerical formats.

The present invention further provides for the accumulation of a number of high rate analog to digital conversion samples into a single high accuracy digital output without a corresponding increase in the clock period or conversion time as compared to a conventional dual-slope analog to digital converter.

The present invention further provides for the elimination of the need for auto zeroing prior to every conversion sample.

The above and additional advantages of the present invention will become apparent to those skilled in the art from a reading of the following detailed description when taken in conjunction with the accompanying drawings.

BRIEF DESCRIPTION OF THE DRAWINGS

FIG. 2 is a flow chart of the program used in the microprocessor of the present invention; and FIG. 3 is a flow chart of the Read A/D subroutine used in the program of FIG. 2.

DESCRIPTION OF THE PREFERRED EMBODIMENT

Figure 1:
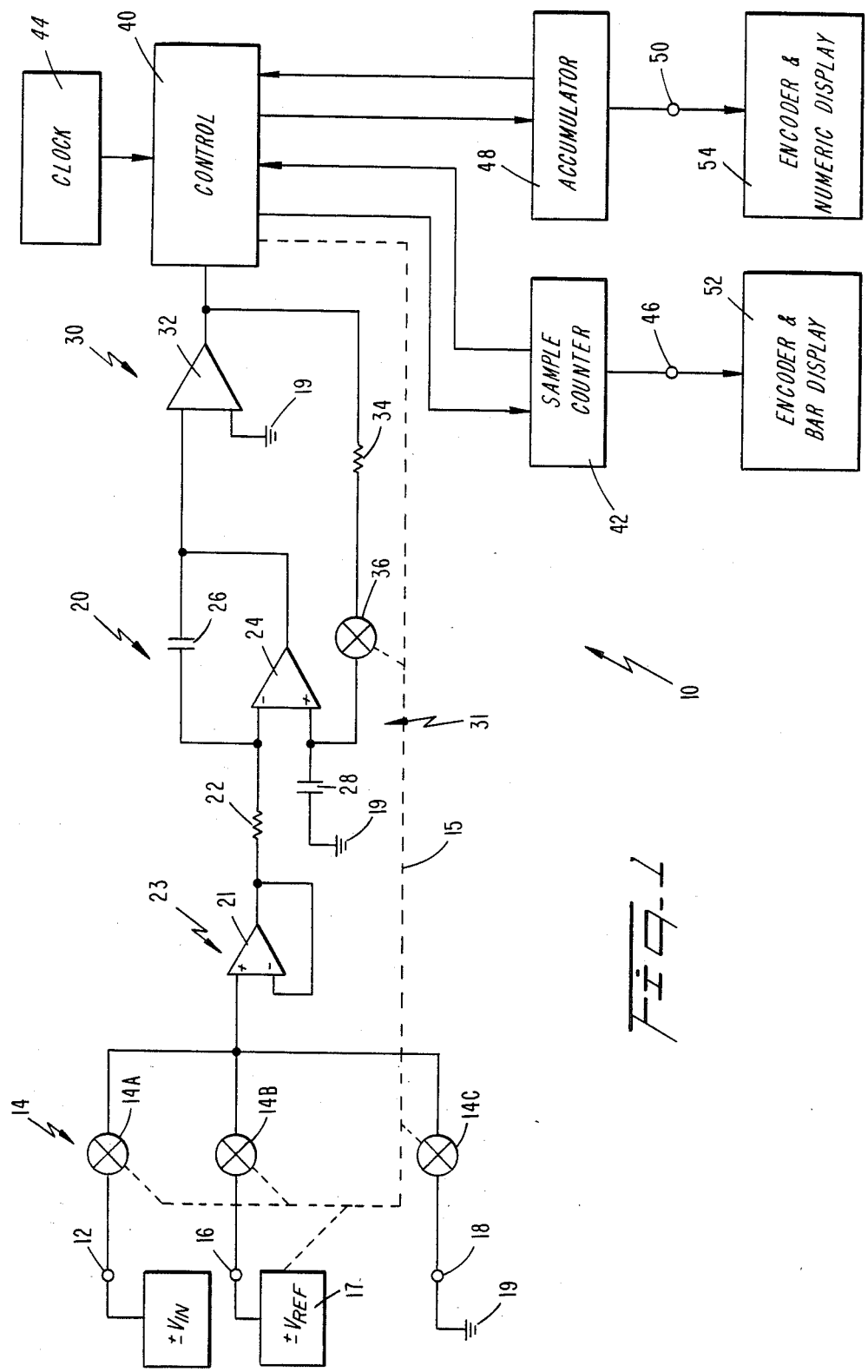
FIG. 1 is a block diagram of the present invention.

Referring now to FIG. 1, therein is shown an analog to digital (A/D) converter 10. The A/D converter 10 has an analog input terminal 12 to which a positive or negative polarity analog voltage signal may be applied which is to be converted to its corresponding positive or negative polarity digital signal. The analog input terminal 12 is connected to an electronic switch 14A in an electronic switch arrangement 14. The arrangement 14 also consists of electronic switches 14B and 14C which are switched by a switch drive 15. The switch 14B is also connected to a reference input terminal 16 to which a known-value, negative or positive polarity fixed reference voltage signal may be applied from a reference input 17 and the switch 14C is connected to a base input terminal 18 to which an accurate baseline voltage is applied during auto zeroing; this baseline voltage source is shown in FIG. 1 as the ground 19.

The switch arrangement 14 is connected to an integrator circuit 20 through a buffer amplifier circuit 23 which includes an operational amplifier 21. The integrator circuit 20 includes resistor 22 connected between buffer amplifier circuit 23 and operational amplifier (op-amp) 24. The negative input and the output of the op-amp 24 are bridged by a capacitor 26 and the positive input is connected by a capacitor 28 to the ground 19.

The output of the integrator circuit 20 is connected to a comparator circuit 30 which consists of a comparator 32 having its negative input connected to the op-amp 24 of the integrator circuit 20 and its positive input connected to the ground 19. The output of the comparator 32 is connected, by a resistor 34 and an electronic switch 36, to between the positive input of the comparator 24 and the capacitor 28. The capacitor 28, through the switch 36 and resistor 34, is caused to correct for zero offset voltages of op-amp 21, op-amp 24, and comparator 32 during auto-zeroing, forming an autozero circuit 31.

The output of the comparator circuit 30 is further connected to a control 40 which could be fixed control logic circuitry or preferably any conventional programmable microprocessor. The control 40 controls the A/D components such as the polarity of the reference input 17 and the switches 14A, 14B, 14C and 36. The control 40 is connected to clock 44 and to sample counter 42. The contents of counter 42 is present at high rate output terminals 46. The control 40 is further connected to an accumulator 48 which can accumulate or sum clock pulses, or groups of pulses called samples from the counter 42, and periodically output them to low rate output terminals 50.

The high rate output terminals 46 are connectable to a conventional encoder circuit and Liquid Crystal Display(LCD) bar display 52 and the low rate output terminals 50 are connectable to a second conventional encoder circuit and LCD numeric display 54. For the preferred embodiment the high rate is chosen to be ten times the low rate of A/D conversion. In the paragraphs following, a low rate output will be referred to as a "conversion", and a high rate output will be referred to as a "sample".

Referring now to FIG. 2, therein is shown the flow diagram for a program which is entered in the control 40. The program starts at a start block 60 and then proceeds to clear block 61 to clear the sample counter 42 before going on to the decision block 62 to determine if the auto zero flag has been set.

If the auto zero flag is set, set auto zero block 63 will cause auto zero circuit 31 to be enabled and switch 14C will be connected to base input terminal 18. The numeric display 54 will then be instructed to display the conversion total in the accumulator 48 according to display digital total block 64. The program will then proceed to clear total block 66 to clear the accumulator 48. After a predetermined wait period to allow the analog auto zero circuit to settle during wait block 68, the program will proceed to the reset auto zero block 70 to reset the auto zero circuit 31 and flag before proceeding to the decision block 72 where a new series of samples is initiated.

If the auto zero flag has not been set prior to decision block 62, the program will proceed directly to the decision block 72 which will cause the control 40 to determine if the desired number of sample cycles, N herein, will have occurred following the next sample. The auto zero flag, if set when tested at decision block 62, causes the control 40 close switch 14C connecting the base input terminal 18 to buffer amplifier circuit 23, and to close the switch 36 which is normally open.

If (N−1) sample cycles have occurred since the previous auto zero, then from decision block 72 the program will proceed to the set auto zero flag block 74. The program then proceeds to the read A/D subroutine block 76. If the desired number of sample cycles, N=10 herein, has not occurred, the program goes directly to the read A/D subroutine block 76.

After the A/D sample has occurred in the block 76, the program proceeds to the display bar sample block 78 to cause the control 40 to direct the counter 42 to display the sample reading on the bar display 52. The program then returns to clear the sample counter block 61, followed by the auto zero decision block 62.

Referring now to FIG. 3, therein is shown the subroutine accessed by the read A/D block 76. The subroutine is entered at enter block 80 and proceeds to wait block 82 which causes the control 40 to wait until the end of an A/D sample at which time program proceeds to the read sample counter block 84.

After the control 40 reads the sample, the program will proceed to first sample decision block 86 to determine if the sample is the first one after an auto zero.

If it is the first sample, the program will proceed to polarity decision block 88 to determine if the value of the sample is less than zero. If the sample is less than zero indicating a negative polarity, a predetermined correction value of +1 digit will be added to the sample value according to add block 90 and the program will return to the main program of FIG. 2 via the exit block 92. If the sample reading is greater than zero indicating a positive polarity the predetermined correction of 1 digit will be subtracted from the reading in subtraction block 94 before going to the exit block 92. The 1 digit correction value applies when the propagation delay through comparator 32 is nominally ½ clock period. Substantially different delays would require a modified correction factor as would be known to those skilled in the art.

At first sample decision block 86, if the sample is not the first sample, the program will proceed to the compare polarity decision block 96. If the polarity of the current sample is the same as that of the previous sample, the program will total the current sample value with any previous total in total block 98 and then will exit via exit block 92. If the polarities are different the program will proceed to polarity decision block 100 to determine again if the sample is less than zero. At polarity decision block 100, if the present sample is less than zero, indicating a negative polarity sample, a correction the value of twice the predetermined correction value will be added to the sample value and totaled by the total block 102 before the program proceeds to the exit block 92. If the sample value is greater than zero indicating a positive polarity, a correction value of twice the predetermined correction value will be subtracted from the sample value and totaled at the total block 104 before the program progresses to the exit block 92.

Each iteration through the read A/D block 76 is defined as a complete sample cycle and the predetermined number N samples result in a numeric conversion with resolution and accuracy identical to what previously would have been the result of a single, low rate, A/D conversion cycle.

In operation, as unknown analog signal is provided as a voltage to the analog input terminal 12 to be applied to the integrator circuit 20 for integration. In the integrator circuit 20, the analog input voltage provides an integrated signal in which the slope is proportional to the input voltage. After a predetermined integration time the control 40 will determine the state at the output of comparator circuit 30, then will cause the switch 14B to apply a fixed value reference voltage of opposite polarity to the reference input terminal 16 to be applied to the integrator circuit 20 for integration. At that time, the control 40 causes the counter 42 to start counting the clock periods being outputted by the clock 44.

The time that it takes for the voltage reference to be integrated to the base reference zero level is directly proportional to the analog input. Thus, if an indication could be provided when the integrated voltage reference exactly equals the base reference, a perfect A/D conversion could be achieved.

In practice, however, two factors cause an unavoidable overshoot of the integrated voltage reference past the exact base reference level. One factor involves the non-zero propagation delay time of comparator circuit 30. The second factor occurs due to the nature of any synchronous digital system, where one clock period is the limit of resolution in the determination of an unknown time interval.

Therefore, following the reference integration, there exists a residue at the output of integrator circuit 20 representing a deviation from the exact base reference level. One component of this residue is digital in nature, representing the fact that counter 42 will run as much as 1 clock period past the time that comparator circuit 30 responds to the crossing of the base reference level. The second component is an analog residual dependent on the small difference between the true input at analog input terminal 12 and its accumulated digital representation.

The digital component of the residue is of determinant magnitude, as it is derived from the voltage reference integrated over that whole clock period which ends immediately after the transition of comparator 32. The analog component of the residue is an accurate representation of the difference between the actual voltage at analog input terminal 12 and the result of the digital conversion up to this point.

In prior art analog to digital converters, the residual value is removed by auto zeroing after each sample so that each subsequent sample starts off from the base reference signal level with no error. While this approach yields an accurate reading, it is time consuming and does not provide for the fast sampling desired to drive a bar graph display in conjunction with a more accurate numeric-digital display.

In the present invention, the residual value of individual samples due to analog effects propagates through all N samples with a neglible error at the Nth sample. The residual value due to digital effects is interpreted for each of the samples, such that the accumulated N samples correctly represents the true analog input with no more than the one-half clock period uncertainty which occurs in the prior art.

In operation, the A/D conversion begins with the control 40 operating under the direction of the program of FIG. 2 and starting with an auto zero flag set in control 40. Thus, in the A/D decision block 62 the program will recognize that an auto zero is to occur, will proceed to block 63 to cause control 40 to enable auto zero circuit 31, and then proceed to block 64 to display the numeric total which will be zero since no samples have yet been taken. The program will then proceed to block 66 to clear the numeric display total and proceed to the wait block 68 where the program will pause for a predetermined length of time. The wait period provides for the required settling time of the analog auto zero circuit 31, necessary to establish an accurate zero baseline before every series of N samples. After the pause, the program will proceed to reset auto zero block 70 signaling control 40 to reset the auto zero flag and de-energize auto zero circuit 31.

From the block 70 the program will proceed to the decision block 72 to determine whether the desired N samples after the auto zero are to be completed next. Since this will not be the condition immediately after startup, the program will proceed to the read A/D block 76. The read A/D block 76 will cause the subroutine of FIG. 3 to be called for creating the first sample of the series.

During the signal integration phase of a sample, the switch 14A, connected to the analog input terminal 12, will allow input of the unknown voltage signal which will be integrated in the integrator circuit 20 of FIG. 1. After a predetermined period of time, the control 40 will cause the switch 14B, connected to the reference input terminal 16, to allow an opposite polarity, known reference voltage signal to be inputted under the control of the control 40. The known reference voltage signal will be integrated by the integrator circuit 20 and, during the reference integration process, the clock periods from the clock 44 will be counted in the counter 42 until such time as the integrated reference input crosses the base input value as determined by the comparator circuit 30. The control 40, when signaled by the transition, or zero crossing signal output, of the comparator 32, will cause the counter 42 to stop counting following the completion of the next whole clock period.

After the A/D sample is completed, the program will wait for a period of time which will make the total length of time for this sample to be the same as for all other samples. Often, this is called "hold". The hold period is optional depending on the A/D converter. During this period, the switch 14C will connect the integrator circuit 20 to the ground 19.

In the following steps, each sample value is computed such that the final accumulated value correctly represents the true analog input with no more than the conventional $\frac{1}{2}$ digit uncertainty common to all A/D methods.

Essentially, the control 40 determines the number of the sample after auto zeroing, the polarity of the output of the comparator circuit 30, and the number of clock periods in the counter 42 to provide a computed sample value for the bar display 52 and then causes the accumulator 48 to sum subsequent computed sample values with previous computed sample values to provide a totalized conversion to the digital display 54.

The subroutine of FIG. 3 determines the computed sample value according to the following parameters:

(a) Sample $S_1$ only (first sample following the auto zero):

$$S_1 = P_1(n-1)$$

(b) Samples $S_2$ through $S_N$ where the polarity of $P_K$ is the same as $P_{K-1}$:

$$S_K = P_K(n)$$

(c) Samples $S_2$ through $S_N$ where $P_K$ is not the same as $P_{K-1}$:

$$S_K = P_K(n-2)$$

where:
 $S_K$ is the Kth sample value
 $S_1$ through $S_N$ equals the 1st through Nth computed sample values
 $P_K$ is the Kth sample polarity N
 n equals the clock periods in the counter 42.

Note: This subroutine assumes a propagation delay time through comparator 32 of nominally $\frac{1}{2}$ clock period.

For the first sample in a series of N after the program reads the counter 42, it progresses to the decision block 86 to determine if the reading taken in the previous block was the first reading after an auto zero. Since it would be, the program will proceed to the decision block 88 to determine polarity of the sample by checking to see if it is less than zero. If it is less than zero, indicating a negative polarity, a single clock period will be added to the reading in block 90 and the program will exit through block 92. If the sample is positive, one clock period will be subtracted in block 94 before the program exits via exit block 92. The one clock period mentioned is a correction value which accounts for the inherent delay of a synchronously clocked system as utilized herein. One clock period is also the maximum uncertainty for any single computed sample value; the summation of N sample readings will have a maximum uncertainty of ½ clock period, however.

Returning to the main program of FIG. 2, the program will proceed to display block 78 to have the control 40 cause the counter 42 to provide the sample reading in the bar display 52. From the display block 78, the program returns to clear sample counter block 61, then to decision block 62 to determine again if the auto zero flag has been set.

Since an auto zero will have occurred prior to the first sample ($S_1$) and the auto zero flag will be reset, the program will proceed to decision block 72 and thence to the read A/D block 76 since generally more than two samples will be taken for the high accuracy A/D conversion.

For the second sample, the subroutine of FIG. 3 will proceed through another A/D sample ($S_2$) and will branch at the decision block 86 and proceed to the compare polarity decision block 96 and if the polarity of the second sample ($S_2$) is the same as that of the previous sample, the program will proceed to the totalize block 98 in which the control 40 causes the accumulator 48 to add the current sample value to the previous sample value and proceed to the exit block 92. From the read A/D block 76 the program will then go to the transmit display block 78 to provide the sample reading by having the output of the counter 42 encoded and processed in a conventional manner to activate the bar display in the encoder and bar display 52. Then, the program will then return to clear sample counter block 61.

From the A/D auto zero flag block 62, with the auto zero flag not set, the program of FIG. 2 will proceed to the decision block 72 and thence to the read A/D block 76. Entering the block 80 of FIG. 3, the program will proceed through the wait block 82, the read counter block 84 and the decision block 86 to branch to the compare polarity block 96. Here, if the third sample ($S_3$) is of the opposite polarity from the previous sample, the program will proceed to the polarity decision block 100 in which a correction value of 2 clock periods will be added algebraically to negative polarity samples or, for positive polarity samples, a correction of 2 clock periods will be subtracted before this current sample is added to the previous readings. The program will then return to the exit block 92 and proceed to the display block 78 of FIG. 2 and then returned to the clear sample counter block 61.

The program is designed to iterate through N samples (for this preferred embodiment, N−10). During the 9th iteration, from the auto zero decision block 62 the program will proceed to the decision block 72 where (N−1) will be equal to 9. The program will then proceed to the set auto zero flag block 74 before entering read A/D block 76 for the final sample in the series of 10.

Due to the set auto zero flag, the final time through the program a branch will occur at block 62 to set auto zero block 63, then the program will proceed through blocks 64, 66, 68, and 70. The program will then proceed to block 72 to initiate a new series of 10 samples.

With the A/D converter 10, it is possible with a single conversion system to display an analog level at both a high sample rate with lower accuracy and a higher accuracy at a lower conversion rate. The first for a fast responding bar graph display and the second for a slower numeric display.

As many possible embodiments can be made of the invention without departing from the scope thereof, it is to be understood that all matters set forth herein or shown in the accompanying drawings are to be interpreted in an illustrative and not a limiting sense.

I claim:

1. A converter circuit for providing both high rate, low accuracy and lower rate, higher accuracy analog to digital conversion, comprising:

analog input means for receiving analog signals;
digital output means for outputting digital signals proportional to said analog signals;
reference input means for receiving a predetermined reference signal;
base input means for receiving a predetermined base reference signal;
integrator means for integrating signals provided thereto and in response generating integrated signals;
comparator means responsive to said integrated signals and said base reference signals to provide a reference integrated signal when said integrated and base reference signals have a predetermined relationship;
switching means for selectively applying to said integrator means signals from said analog, reference, or base input means and interconnecting said comparator means and said base input means;
clock means for providing clock signals at a predetermined rate;
counter means responsive to said clock means for counting clock periods therefrom and providing to said digital output means a clock period count; and
control means operatively connected to said switching means, said integrator means, and said counter means,
said control means including:
(a) means for controlling said switching means to connect said analog input means to said integrator means for developing said analog input integrated signal, and to connect said reference input means to said integrator means until said comparator means generates said reference integrated signal to define a sample cycle;
(b) means for causing said counter means to count during a period extending from the connection of said reference input means to said integrator means to generation of said reference integrated signal by said comparator means;
(c) means responsive to said reference integrated signal to cause said counter means to apply the count to a digital output means as a high conversion rate, low accuracy output;
(d) means for causing generation of a plurality of said sample cycles; and
(e) means for causing said switching means to connect said integrator and said comparator means to said base input means after generation of a predetermined number of said sample cycles;
means for accumulating said sample cycles; and
means for applying the accumulated predetermined number of sample cycles to the digital output means as a low conversion rate, high accuracy output.

2. The analog to digital converter as claimed in claim 1 including display means driven by said digital output means providing a visual indication proportional in size to said digital signal.

3. The analog to digital converter as claimed in claim 1 or 2 wherein said accumulator means is responsive to said control means and to said counter means to accumulate said digital signals after each sample cycle and provide an output digital signal proportional to the sum of said digital signals after generation of said predetermined number of said sample cycles.

4. The analog to digital converter as claimed in claim 3 including numeric display means connected to said accumulator means for providing a visual numeric indication of said output digital signal.

5. A high resolution analog to digital converter comprising:
   analog input means for receiving negative or positive polarity analog signals;
   digital output means for outputting digital signals of the same polarity as, and proportional to, said analog signals;
   reference input means for receiving predetermined reference signals of a positive or negative polarity;
   zeroing means for receiving a zero reference signal;
   integrator means for integrating signals provided thereto and in response generating integrated signals;
   comparator means responsive to said integrated reference signal and to said zero reference signal to provide a reference integrated signal when said integrated and zero reference signals have a predetermined relationship;
   switching means for selectively connecting said integrator means to said analog input, reference input, or zeroing means, and said comparator means to said zeroing means;
   clock means for generating clock periods at a predetermined rate;
   counter means for counting said clock periods and applying a corresponding count to said digital output means; and
   control means operatively connected to said switching, integrator, comparator, clock, and counter means,
   said control means including means for causing said switching means to connect said analog input means to said integrator means to develop an integrated analog signal for a predetermined period and then to connect said reference input means having a polarity opposite that of said analog signals to said integrator means at the end of said predetermined period until said reference integrated signal is generated to complete a sample cycle; means for starting and stopping said counter means during a sample cycle when said reference signal and said reference integrated signals are respectively provided; means for controlling said digital output means to provide a digital signal of the same polarity as said analog signal and determined from clock periods counted by said counter means during said sample cycle, and means for controlling said switching means to apply said zero reference signal to said integrator means and to said comparator means only after a predetermined number of said sample cycles constituting a conversion; and
   means for accumulating a conversion count.

6. The analog to digital converter as claimed in claim 5 including a longitudinally extending display providing a visual indication proportional in length to said digital output signal.

7. The analog to digital converter as claimed in claim 5 or 6 wherein:
   said accumulator means is operatively connected to said control means and said counter means for summing the clock periods in said counter means and includes means for modifying said clock period summation; and wherein
   said control means includes means for controlling said accumulator means immediately following the first sample cycle to cause the content of the accumulator to be equal to the clock periods counted decremented by a predetermined correction value, multiplied by a polarity as determined from said reference integrated signal, and for sample cycles subsequent to said first sample cycle controlling said content to be equal to the clock periods counted multiplied by said polarity, or to the clock periods counted decremented by twice said predetermined correction value multiplied by said polarity when said polarity is respectively the same or opposite the said polarity obtained at the previous sample cycle, and means for controlling said accumulator menas to provide net accumulated contents as a corrected output to said digital output means after an occurrence of said predetermined number of said sample cycles.

8. The analog to digital converter as defined in claim 7 wherein said digital output means includes a numeric display providing a visual numeric indication of the clock periods in said accumulator means following the occurrence of the end of said predetermined number of sample cycles whereby the output of said counter means provides higher speed analog to digital samples than the corrected output of said accumulator means while said accumulator means corrected output provides greater accuracy than said counter means output.

9. A converter circuit for providing both high rate, low accuracy and lower rate, higher accuracy analog to digital conversion, comprising:
   analog input means for receiving negative or positive polarity analog signals;
   reference input means for providing predetermined reference signals of a positive or negative polarity;
   first and second digital output means for outputting digital signals proportional to said analog signals;
   zeroing means for providing a zero reference signal;
   an integrator circuit for integrating signals provided thereto and in response generating integrated signals;
   a comparator responsive to said integrated reference signal and to the zero reference signal to provide a reference integrated signal when the integrated and zero reference signals have a predetermined relationship;
   first switch means for selectively connecting said integrator circuit to said analog input, reference input or zeroing means;
   second switch means, normally open, closeable to connect said comparator means to said zeroing means;
   a clock providing clock periods at a predetermined rate;
   a counter for counting the clock periods;
   an accumulator to accumulate and modify clock periods; and control means operatively connected to said first and second switch means, said reference input means, said counter, and said accumulator, said control means including means for causing said first switch means to connect said analog input means to said integrator circuit for a predetermined period and then to connect said reference input means to said integrator circuit until said reference integrated signal is provided to complete a sample cycle, means for determining the polarity of said analog signal and controlling said reference input means provide a predetermined reference signal of the opposite polarity, means responsive to the start of an integration of said reference signal and to the occurrence of the reference integrated signal to respectively start and stop said counter, means for controlling said counter to provide a corrected clock period count to said first output means as a digital signal proportional to the analog signal during said sample cycle, means for controlling said accumulator means immediately following the first sample cycle to cause the content of the accumulator to be equal to the clock periods counted decremented by a predetermined correction value, multiplied by a polarity as determined from said reference integrated signal, and for sample cycles subsequent to said first sample cycle controlling said content to be equal to the clock periods counted multiplied by said polarity, or to the clock periods counted decremented by twice said predetermined correction value multiplied by said polarity when said polarity is respectively the same or opposite the said polarity obtained at the previous sample cycle, and means for controlling said accumulator means to provide net accumulated contents as a corrected output to said digital output means after an occurrence of said predetermined number of said sample cycles, said control means further including means for controlling said first and second switch means respectively to connect said integrator circuit and said comparator to said zeroing means, means for controlling said accumulator means to apply the accumulated clock period count to said second output means following an occurrence of a predetermined number of said sample cycles.

10. The analog to digital converter as claimed in claim 9 wherein said predetermined correction value is one clock period.

11. The analog to digital converter as claimed in claim 9 including a longitudinally extending segmented liquid crystal display providing a digital indication proportional in length to the output of said first digital output means.

12. The analog to digital converter as claimed in claim 9 including a numerical, segmented liquid crystal display providing a visual, numerical indication of the output of said second digital output means.

13. A method of analog to digital conversion providing both high rate, low accuracy and lower rate, higher accuracy conversion, comprising the steps of:
(a) integrating an input analog signal for a predetermined period from a predetermined base signal value to a resultant first value;
(b) integrating a reference signal from said first value to said predetermined base value;
(c) timing a period required for the reference signal to reach said predetermined base signal value in digital periods and making suitable digital corrections to said timing period;
(d) outputting said corrected signal period to provide a high rate, low accuracy conversion signal;
(e) repeating steps (a)–(d) a predetermined number of times; and
(f) accumulating the result of step (e) and outputting the accumulated result to provide a lower rate, higher accuracy conversion signal; including
  (1) accumulating a first digital period count decremented by a predetermined correction value;
  (2) accumulating second and subsequent digital period counts when the polarity of a present output is the same as that of the previous output; and
  (3) accumulating second and subsequent counts decremented by twice the correction value when the polarity of the present output is different from that of the previous output.

14. A method of analog to digital conversion for providing both high rate, low accuracy and lower rate, higher accuracy analog to digital conversions, comprising the steps of:
(a) inputting an analog signal of a first polarity into an integrator circuit;
(b) integrating said analog signal for a predetermined period from a predetermined base signal level to a resultant first signal level;
(c) inputting a predetermined reference signal of an opposite polarity into said integrator circuit after said predetermined period;
(d) integrating said reference signal from said first signal level to said predetermined base signal level;
(e) timing the period required for the reference signal to pass said predetermined base signal level in clock periods and correcting said timing period;
(f) outputting said corrected timing period to provide a high rate, low accuracy conversion signal;
(g) repeating steps (a)–(f) a predetermined number of times;
(h) accumulating the result of step (g) and outputting the accumulated result to provide a lower rate, higher accuracy conversion signal; and
(i) setting said integrator circuit at said predetermined base signal level;
and including the additional steps of
(j) setting an accumulator equal to the number of clock periods in the first of a series of sample cycles decremented by a predetermined correction value;
(k) setting said accumulator equal to the previous setting incremented by a present clock period for the second and subsequent sample cycles when the polarity of the present integrated reference signal is the same as that of the previous integrated reference signal;
(l) setting said accumulator equal to the previous setting incremented by the present clock period decremented by twice the correction value when the polarity of the present integrated reference signal is different from that of the previous integrated reference signal; and
(m) accumulating said corrected clock periods as a digital signal after an occurrence of said plurality of sample cycles.

* * * * *